US011837645B2

(12) United States Patent
Hwang et al.

(10) Patent No.: US 11,837,645 B2
(45) Date of Patent: Dec. 5, 2023

(54) METHOD OF MANUFACTURING A SEMICONDUCTOR DEVICE

(71) Applicant: SAMSUNG ELECTRONICS CO., LTD., Suwon-si (KR)

(72) Inventors: Yoontae Hwang, Seoul (KR); Wandon Kim, Seongnam-si (KR); Geunwoo Kim, Seoul (KR); Heonbok Lee, Suwon-si (KR); Taegon Kim, Seoul (KR); Hanki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/085,871

(22) Filed: Dec. 21, 2022

(65) Prior Publication Data

US 2023/0118906 A1 Apr. 20, 2023

Related U.S. Application Data

(63) Continuation of application No. 17/231,126, filed on Apr. 15, 2021, now Pat. No. 11,538,916.

(30) Foreign Application Priority Data

Sep. 1, 2020 (KR) .................. 10-2020-0111053

(51) Int. Cl.
*H01L 29/45* (2006.01)
*H01L 29/78* (2006.01)
(Continued)

(52) U.S. Cl.
CPC ........ *H01L 29/45* (2013.01); *H01L 21/28518* (2013.01); *H01L 21/76805* (2013.01);
(Continued)

(58) Field of Classification Search
CPC .............. H01L 29/45; H01L 21/28518; H01L 21/76805; H01L 21/76843;
(Continued)

(56) References Cited

U.S. PATENT DOCUMENTS 5,899,741 A * 5/1999 Tseng ................ H01L 21/76877
257/E21.585
6,242,349 B1 * 6/2001 Nogami ............ H01L 21/76843
205/184

(Continued)

FOREIGN PATENT DOCUMENTS

CN 110010470 A 7/2019 ......... H01L 21/0262
JP H 05129452 A 5/1993
(Continued)

*Primary Examiner* — Earl N Taylor
(74) *Attorney, Agent, or Firm* — Lee IP Law, P.C.

(57) ABSTRACT

A semiconductor device including a substrate; a fin active region on the substrate and extending in a first direction; a gate structure extending across the fin active region and extending in a second direction; a source/drain region in the fin active region on a side of the gate structure; an insulating structure covering the gate structure and the source/drain region; and contact structures penetrating through the insulating structure and respectively connected to the source/drain region and the gate structure, wherein one of the contact structures includes a seed layer on the gate structure or the source/drain regions and including lower and upper regions, the lower region having a first grain size and the upper region being amorphous or having a grain size different from the first grain size, and a contact plug on an upper region of the seed layer and having a second grain size.

20 Claims, 13 Drawing Sheets

(51) Int. Cl.
    H01L 29/66      (2006.01)
    H01L 29/417     (2006.01)
    H01L 29/08      (2006.01)
    H01L 23/532     (2006.01)
    H01L 23/485     (2006.01)
    H01L 23/522     (2006.01)
    H01L 21/768     (2006.01)
    H01L 21/8234    (2006.01)
    H01L 29/06      (2006.01)
    H01L 29/775     (2006.01)
    H01L 29/423     (2006.01)
    H01L 29/786     (2006.01)
    H01L 21/285     (2006.01)

(52) U.S. Cl.
    CPC .. *H01L 21/76843* (2013.01); *H01L 21/76859*
         (2013.01); *H01L 21/76886* (2013.01); *H01L
         21/823431* (2013.01); *H01L 23/485* (2013.01);
         *H01L 23/5226* (2013.01); *H01L 23/53266*
         (2013.01); *H01L 29/0673* (2013.01); *H01L
         29/0847* (2013.01); *H01L 29/41766* (2013.01);
         *H01L 29/41791* (2013.01); *H01L 29/42392*
         (2013.01); *H01L 29/456* (2013.01); *H01L
         29/66795* (2013.01); *H01L 29/775* (2013.01);
         *H01L 29/7851* (2013.01); *H01L 29/78696*
         (2013.01)

(58) Field of Classification Search
    CPC ......... H01L 21/76859; H01L 21/76886; H01L
         21/823431; H01L 23/485; H01L 23/5226;
         H01L 23/53266; H01L 29/0673; H01L
         29/0847; H01L 29/41766; H01L
         29/41791; H01L 29/42392; H01L 29/456;
         H01L 29/66795; H01L 29/775; H01L
         29/7851; H01L 29/78696
    See application file for complete search history.

(56) References Cited

U.S. PATENT DOCUMENTS

| | | | | |
|---|---|---|---|---|
| 6,579,794 B1* | 6/2003 | Oh | H01L 21/28556 | 257/E21.17 |
| 7,166,502 B1* | 1/2007 | Kwon | H01L 29/78603 | 438/FOR. 363 |
| 7,504,725 B2* | 3/2009 | Kim | H01L 21/28556 | 257/751 |
| 7,696,092 B2* | 4/2010 | Lopatin | H01L 21/288 | 438/653 |
| 7,868,456 B2* | 1/2011 | Suzuki | H01L 23/53223 | 428/209 |
| 8,211,797 B2* | 7/2012 | Yang | H01L 27/1218 | 257/E21.585 |
| 8,778,797 B2* | 7/2014 | Gao | H01L 21/76877 | 438/677 |
| 9,082,791 B2* | 7/2015 | Kwon | H01L 29/66765 | |
| 9,082,824 B2* | 7/2015 | Reber | H01L 23/481 | |
| 10,256,342 B2* | 4/2019 | Park | H01L 27/0886 | |
| 10,340,219 B2* | 7/2019 | Hong | H01L 23/485 | |
| 10,734,280 B2 | 8/2020 | Yim | H01L 21/76843 | |
| 11,158,539 B2 | 10/2021 | Wang | H01L 21/76804 | |
| 11,393,756 B2 | 7/2022 | Greenlee | H01L 27/11582 | |
| 11,404,312 B2 | 8/2022 | Wu | H01L 23/53266 | |
| 2003/0057527 A1* | 3/2003 | Chung | H01L 21/76862 | 257/E21.171 |
| 2005/0227479 A1* | 10/2005 | Feng | H01L 21/76877 | 257/E21.585 |
| 2007/0117372 A1* | 5/2007 | Hsu | H01L 21/76895 | 257/E21.59 |
| 2008/0251851 A1* | 10/2008 | Pan | H01L 29/7843 | 257/E29.345 |
| 2009/0032844 A1* | 2/2009 | Ogura | H01L 29/7848 | 257/190 |
| 2009/0236627 A1* | 9/2009 | Kim | H05K 3/1258 | 257/773 |
| 2012/0199887 A1* | 8/2012 | Chan | C23C 16/16 | 118/725 |
| 2014/0011358 A1* | 1/2014 | Chen | H01L 21/28506 | 438/680 |
| 2014/0159252 A1* | 6/2014 | Han | H01L 23/5283 | 257/775 |
| 2016/0190325 A1* | 6/2016 | Liu | H01L 21/76816 | 257/770 |
| 2016/0300765 A1* | 10/2016 | Li | H01L 21/28568 | |
| 2017/0040214 A1* | 2/2017 | Lai | H01L 21/32136 | |
| 2018/0096934 A1* | 4/2018 | Siew | H01L 23/535 | |
| 2018/0130707 A1* | 5/2018 | Clendenning | H01L 21/76865 | |
| 2018/0286957 A1* | 10/2018 | Bae | H01L 27/1211 | |
| 2019/0131421 A1* | 5/2019 | Shen | H01L 29/6656 | |
| 2019/0148226 A1* | 5/2019 | Yim | H01L 23/5226 | 257/383 |
| 2019/0157405 A1* | 5/2019 | Huang | H01L 29/41791 | |
| 2019/0164827 A1* | 5/2019 | Yang | H01L 21/2855 | |
| 2019/0164885 A1* | 5/2019 | Yang | H01L 23/5283 | |
| 2019/0333808 A1* | 10/2019 | Wu | H01L 23/535 | |
| 2019/0333856 A1 | 10/2019 | Siew | H01L 21/76807 | |
| 2020/0035787 A1* | 1/2020 | Wang | H01L 21/76897 | |
| 2020/0235214 A1 | 7/2020 | Huang | H01L 29/66795 | |
| 2020/0343350 A1* | 10/2020 | Lee | H01L 29/0847 | |
| 2020/0395251 A1* | 12/2020 | Chiu | H01L 29/785 | |
| 2021/0035861 A1* | 2/2021 | Chen | H01L 21/76856 | |
| 2021/0057533 A1* | 2/2021 | Hwang | H01L 21/28518 | |
| 2021/0098295 A1* | 4/2021 | Wang | H01L 21/76877 | |
| 2021/0098583 A1* | 4/2021 | Tsai | H01L 29/41766 | |
| 2021/0175334 A1* | 6/2021 | Yamazaki | H01L 27/1225 | |
| 2021/0189545 A1* | 6/2021 | Hoi | C23C 14/3435 | |
| 2021/0217861 A1* | 7/2021 | Song | H01L 29/401 | |
| 2021/0226018 A1* | 7/2021 | Wu | H01L 29/41766 | |
| 2021/0273102 A1* | 9/2021 | Su | H01L 21/823468 | |
| 2021/0287990 A1* | 9/2021 | Greenlee | H01L 21/76843 | |
| 2021/0327877 A1* | 10/2021 | Lee | H01L 29/66795 | |
| 2021/0343713 A1* | 11/2021 | Ju | H01L 29/42392 | |
| 2021/0343851 A1* | 11/2021 | Wang | H01L 29/42376 | |
| 2021/0391471 A1* | 12/2021 | Vellianitis | H10B 51/30 | |
| 2021/0407902 A1* | 12/2021 | Chouksey | H01L 29/78696 | |
| 2021/0408276 A1* | 12/2021 | Fu | H01L 21/76814 | |
| 2022/0045052 A1* | 2/2022 | Huang | H01L 29/0847 | |
| 2022/0051991 A1* | 2/2022 | Hopkins | H10B 41/30 | |
| 2022/0059654 A1* | 2/2022 | Kim | H01L 29/775 | |
| 2022/0068650 A1* | 3/2022 | More | H01L 29/0653 | |
| 2022/0069100 A1* | 3/2022 | Hwang | H01L 21/823431 | |
| 2022/0069129 A1* | 3/2022 | Kim | H01L 29/41766 | |
| 2022/0084879 A1* | 3/2022 | Wu | H01L 21/76897 | |
| 2022/0102510 A1* | 3/2022 | Cook | H01L 29/785 | |
| 2022/0102522 A1* | 3/2022 | Dewey | H01L 21/823475 | |
| 2022/0108919 A1 | 4/2022 | Wang | H01L 21/76805 | |
| 2022/0136092 A1* | 5/2022 | Rajagopalan | C23C 14/14 | 427/248.1 |
| 2022/0157832 A1* | 5/2022 | Yamaguchi | H01L 29/516 | |

FOREIGN PATENT DOCUMENTS

| | | |
|---|---|---|
| JP | H 0629405 A | 2/1994 |
| KR | 10-2001-0002665 A | 1/2001 |
| KR | 10-0457372 | 11/2004 |

* cited by examiner

METHOD OF MANUFACTURING A SEMICONDUCTOR DEVICE

CROSS-REFERENCE TO RELATED APPLICATIONS

This is a continuation application based on pending application Ser. No. 17/231,126, filed Apr. 15, 2021, the entire contents of which is hereby incorporated by reference.

Korean Patent Application No. 10-2020-0111053, filed on Sep. 1, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device includes an integrated circuit including a variety of transistors. With the trend for an increase in integration density of such a semiconductor device, scaling down of transistors has been increasingly accelerated. A critical dimension (CD) of a contact has also decreased.

SUMMARY

The embodiments may be realized by providing a semiconductor device including a substrate; a fin active region on the substrate and extending in a first direction, the first direction being parallel to an upper surface of the substrate; a gate structure extending across the fin active region and extending in a second direction, the second direction being different from the first direction and parallel to the upper surface of the substrate; a source/drain region in the fin active region on at least one side of the gate structure; an insulating structure covering the gate structure and the source/drain region; and a first contact structure and a second contact structure penetrating through the insulating structure and respectively connected to the source/drain region and the gate structure, wherein at least one of the first contact structure and the second contact structure includes a seed layer on at least one of the gate structure and the source/drain regions, the seed layer including a lower region and an upper region, the lower region having a first grain size and the upper region being amorphous or having a grain size different from the first grain size, and a contact plug on an upper region of the seed layer and having a second grain size.

The embodiments may be realized by providing a semiconductor device including a substrate having a contact region; a first insulating layer on the substrate and having a first contact hole connected the contact region; a seed layer including a first polycrystalline conductive material on the contact region within the first contact hole and having a lower region having a first grain size and an upper region having a grain size greater than the first grain size; a first contact via filling the first contact hole on the seed layer, the first contact via including a second polycrystalline conductive material having a second grain size, and including a grain adjustment region that is amorphous or has a grain size that is different from the second grain size; a second insulating layer on the first insulating layer and having a second contact hole, the second contact hole exposing the grain adjustment region; and a second contact via on the grain adjustment region within the second contact hole and filling the second contact hole.

The embodiments may be realized by providing a semiconductor device including a substrate having a contact region; a first insulating layer on the substrate and having a first contact hole connected to the contact region; a seed layer including a first polycrystalline conductive material on the contact region within the first contact hole, and having a lower region and an upper region, the lower region having a first grain size and the upper region being amorphous or having a grain size smaller than the first grain size; a first contact via including a second polycrystalline conductive material, the first contact via filling the first contact hole and having a second grain size and having a grain adjustment region having a grain size greater than the second grain size; a second insulating layer on the first insulating layer and having a second contact hole connected to the grain adjustment region; and a second contact via on the grain adjustment region within the second contact hole and filling the second hole.

BRIEF DESCRIPTION OF DRAWINGS

Features will be apparent to those of skill in the art by describing in detail exemplary embodiments with reference to the attached drawings in which.

DETAILED DESCRIPTION

Figure 1:
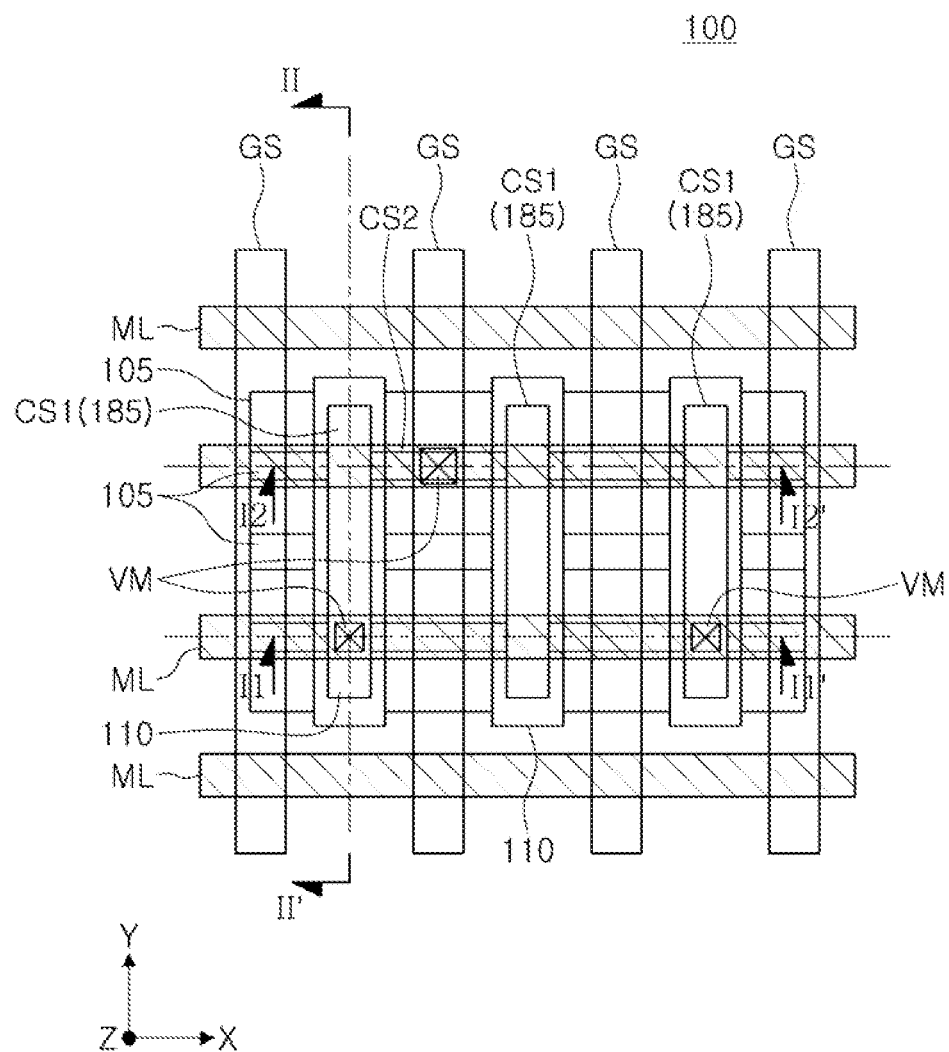
FIG. 1 is a plan view of a semiconductor device according to an example embodiment.
Figure 2A:
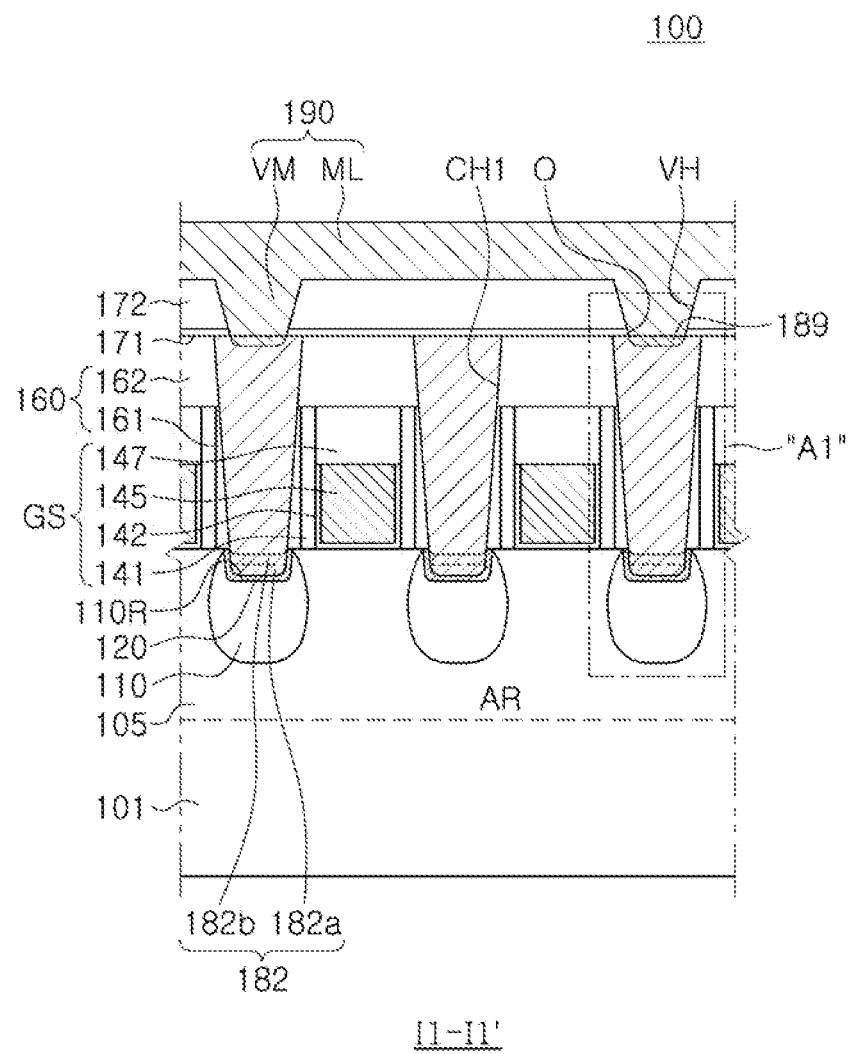
FIGS. 2A to 2C are cross-sectional views of the semiconductor device of FIG. 1, taken along lines I1-I1', I2-I2', and respectively.
Figure 2B:
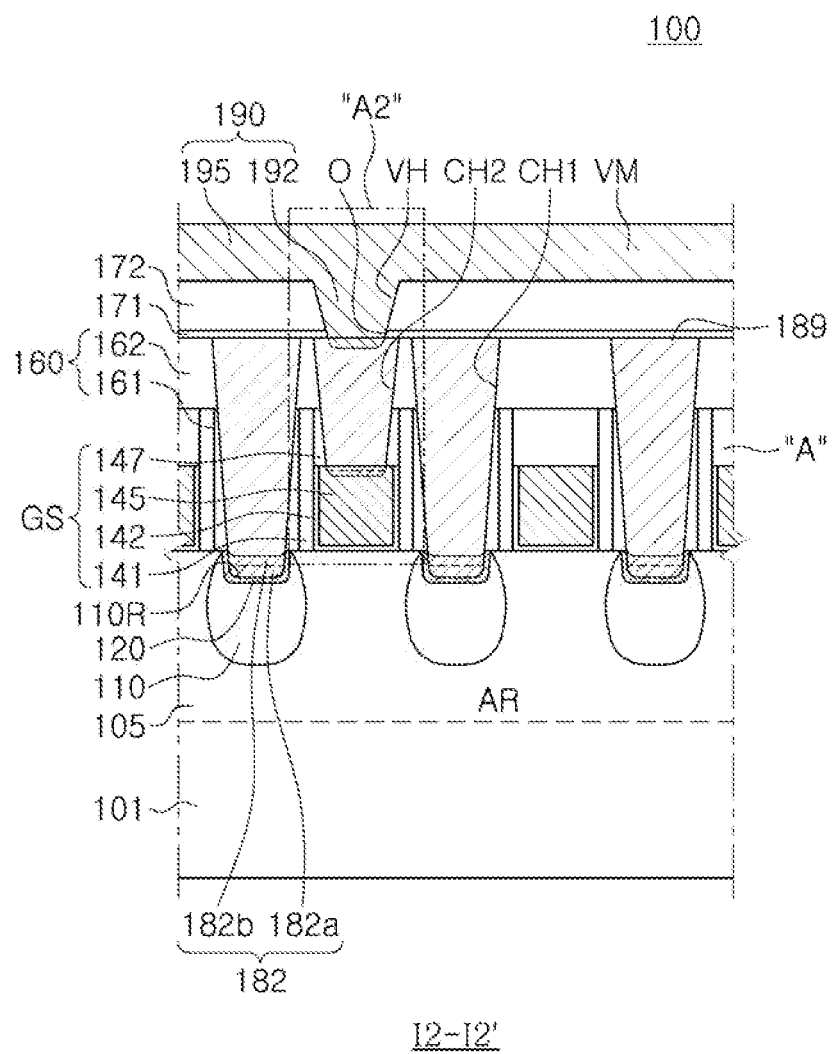
Figure 2C:
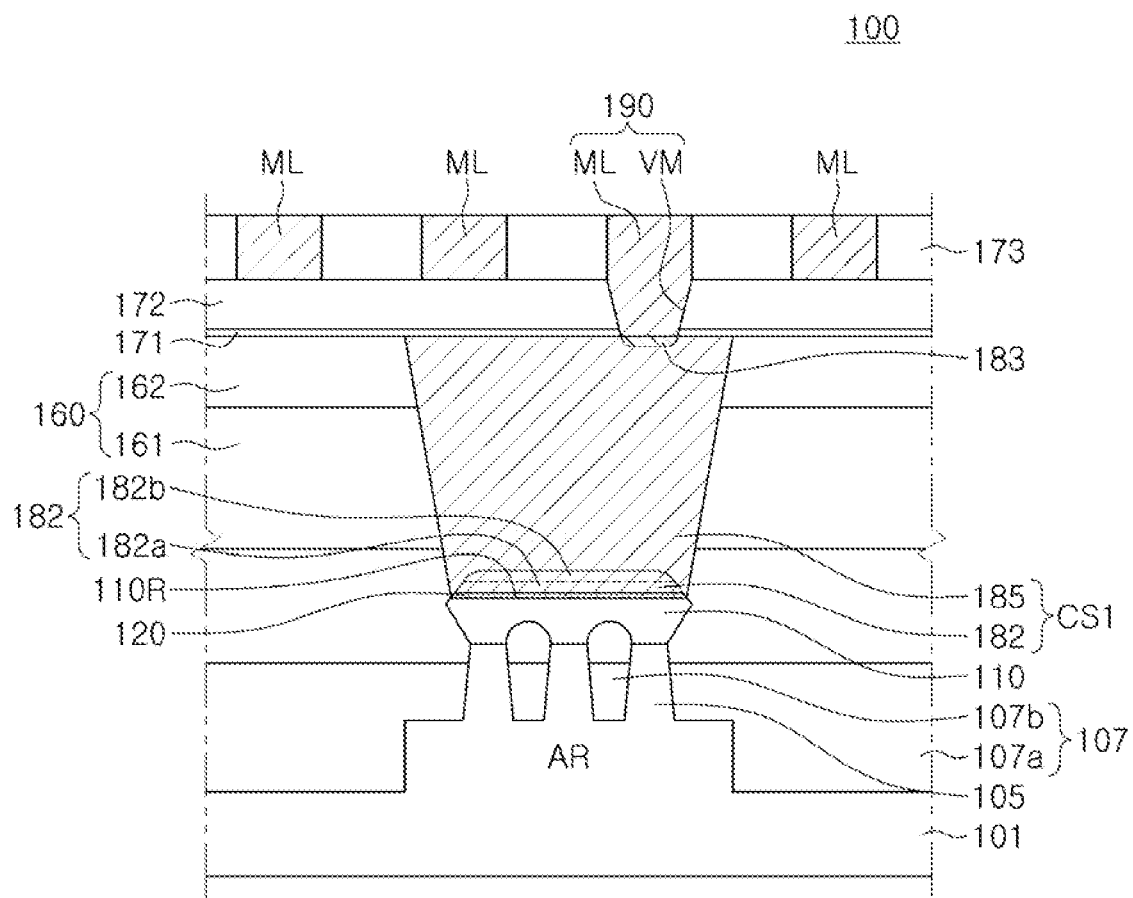

FIG. 1 is a plan view of a semiconductor device 100 according to an example embodiment, and FIGS. 2A to 2C are cross-sectional views of the semiconductor device 100 of FIG. 1, taken along lines I1-I1', I2-I2', and respectively.

Referring to FIGS. 1 and 2A to 2C, the semiconductor device 100 may include a fin active region 105 on a substrate 101, extending (e.g., lengthwise) in a first direction (an X direction of FIG. 1), parallel to an upper surface of the substrate 101, and a gate structure GS extending (e.g., lengthwise) in a second direction (a Y direction of FIG. 1), different from the first direction (the X direction), across the fin active region 105.

The substrate 101 may include a group IV semiconductor such as Si or Ge, a group IV-IV compound semiconductor such as SiGe or SiC, or a group III-V compound semiconductor such as GaAs, InAs, or InP. The substrate 101 may have an active region AR. The active region AR may be a conductive region such as a well doped with impurities or a structure doped with impurities. In an implementation, the active region AR may be an N-type well for a PMOS transistor or a P-type well for an NMOS transistor. As used herein, the term "or" is not an exclusive term, e.g., "A or B" would include A, B, or A and B.

The fin active region 105 may be on an upper surface of the active region AR. The fin active region 105, employed in the present embodiment, may have a structure protruding from, on, or above the upper surface of the active region AR in a third direction (a Z direction of FIG. 1), perpendicular to the first and second directions, and is also referred to as an "active fin" in the specification.

In an implementation, as illustrated in FIG. 1 and FIG. 2C, three active fins 105 may be included. In an implementation, a single active fin or another plurality of active fins may be provided. As illustrated in FIG. 1, three active fins 105 may be arranged parallel to each other and spaced apart in the second direction in the active region AR, and may extend in the first direction (the X direction), respectively. The active fin 105 may be an active region of a transistor.

A device isolation film 107 may define the active region AR and the active fin 105. In an implementation, the device isolation film 107 may include an insulating material such as a silicon oxide. The device isolation film 107 may include a first isolation region 107a, defining the active region AR, and a second isolation region 107b defining the active fin 105. The first isolation region 107a may have a deeper bottom surface than the second isolation region 107b. In an implementation, the first isolation region 107a is also referred to as a deep trench isolation (DTI) region, and the second isolation region 107b is also referred to as a shallow trench isolation (STI) region. The second isolation region 107b may be on the active region AR. As described above, the active fin 105 may have a portion protruding from an upper surface of the second isolation region 107b while penetrating through the second isolation region 107b.

As illustrated in FIG. 1, the gate structure GS may have a line structure extending in the second direction (the Y direction), intersecting the first direction (the X direction). The gate structure GS may overlap a certain region of the active fin 105.

The gate structure GS may include gate spacers 141, a gate insulating layer 142, and a gate electrode 145 sequentially between the gate spacers 141, and gate capping layer 147 on the gate electrode 145.

The gate electrode 145 may include doped polysilicon, a metal, a conductive metal nitride, conductive metal carbide, or combinations thereof. In an implementation, the gate electrode 145 may be formed of Al, Cu, Ti, Ta, W, Mo, TaN, NiSi, CoSi, TiN, WN, TiAl, TiAlN, TaCN, TaC, TaSiN, or combinations thereof. In an implementation, the gate electrode 145 may include a work function metal-containing layer and a gap-fill metal layer. The work function metal-containing layer may include Ti, W, Ru, Nb, Mo, Hf, Ni, Co, Pt, Yb, Tb, Dy, Er, or Pd. The gap-fill metal layer may be formed of a W layer or an Al layer. In an implementation, the gate electrode 145 may include a stacked structure of TiAlC/TiN/W, a stacked structure of TiN/TaN/TiAlC/TiN/W, or a stacked structure of TiN/TaN/TiN/TiAlC/TiN/W.

The gate insulating layer 142 may be on a bottom surface and a sidewall of the gate electrode 145 and may extend in the second direction (the Y direction of FIG. 1) along the bottom surface of the gate electrode 145. The gate insulating layer 142 may be between the gate electrode 145 and the active fin 105 and between the gate electrode 145 and an upper surface of the device isolation film 107. In an implementation, the gate insulating layer 142 may be formed of a silicon oxide, a silicon oxynitride, a high-k dielectric material having a higher dielectric constant than the silicon oxide, or combinations thereof. The high-k dielectric material may include a metal oxide or a metal oxynitride. In an implementation, the high-k dielectric material, which may be used as the gate insulating layer 142, may include $HfO_2$, HfSiO, HfSiON, HfTaO, HfSiO, HfZrO, $ZrO_2$, $Al_2O_3$, or combinations thereof.

The gate capping layer 147 may be on the gate electrode 145. The gate capping layer 147 may cover an upper surface of the gate electrode 145 and may extend in the second direction (the Y direction of FIG. 1). In an implementation, the gate capping layer 147 may include a silicon nitride or a silicon oxynitride. The gate spacer 141 may be on both sidewalls of the gate electrode 145 and on both sidewalls of the gate capping layer 147. The gate spacer 141 may extend in the same direction in which the gate electrode 145 extends, on both sidewalls of the gate electrode 145, and the gate insulating layer 142 may be between the gate electrode 145 and the gate spacer 141. In an implementation, the gate spacer 141 may include a silicon oxide ($SiO_x$), a silicon nitride ($SiN_x$), a silicon oxynitride ($SiO_xN_y$), a silicon carbide nitride ($SiC_xN_y$), a silicon oxycarbide nitride ($SiO_xC_yN_z$), or combinations thereof. In an implementation, the gate spacer 141 may include a plurality of layers formed of different materials. In an implementation, as illustrated in FIGS. 2A and 2B, the gate spacer 141 may be a single layer. In an implementation, the gate spacer 141 may include a plurality of gate spacers sequentially stacked on the sidewall of the gate electrode 145 and having different dielectric constants.

The semiconductor device 100 according to the present embodiment may include a source/drain region 110 in a certain region of the active fins 105 on opposite sides adjacent to the gate structure GS.

Forming the source/drain region 110 may include forming a recess in a certain region of the active fin 105 and performing selective epitaxial growth (SEG) on the recess. The source/drain regions 110 may include Si, SiGe, or Ge, and the source/drain regions 110 may have different materials or different shapes depending on an N-type or P-type transistor. In an implementation, in the case of a PMOS transistor, the source/drain regions 110 may include silicon-germanium (SiGe) and may be doped with P-type impurities (e.g., boron (B), indium (In), gallium (Ga), or the like). A cross section (a Y-Z cross section, see FIG. 2C) of the source/drain region 110 may have a pentagonal shape. In the case of an NMOS transistor, the source/drain regions 110 include silicon and may be doped with N-type impurities (e.g., phosphorus (P), nitrogen (N), arsenic (As), antimony (Sb), or the like). The cross-section (the Y-Z cross section) of the source/drain region 110 may have a hexagonal shape or a polygonal shape having a gentle angle. In an implementation, the source/drain region 110 may constitute a three-dimensional (3D) semiconductor device such as a Fin-FET, together with the active fin 105 and the gate structure GS.

The semiconductor device 100 according to the present embodiment may include a first contact structure CS1, connected to the source/drain region 110 through an insulating portion or insulating structure 160, and a second contact structure CS2 connected to the gate electrode 145 of the gate structure GS through the insulating structure 160.

The insulating structure 160 may include an intergate insulating layer 161 and a capping insulating layer 162 sequentially on the source/drain regions 110. The intergate insulating layer 161 may be between the adjacent gate structures GS and may cover the source/drain region 110 and the device isolation film 107. The intergate insulating layer 161 may have an upper surface substantially coplanar with upper surfaces of the gate spacer 141 and the gate capping layer 147. In an implementation, at least one of the intergate insulating layer 161 and the capping insulating layer 162 may include a silicon nitride, a silicon oxide, or a silicon oxynitride. In an implementation, the intergate insulating layer 161 may include TEOS, USG, PSG, BSG, BPSG, FSG, SOG, TOSZ, or combinations thereof. The intergate insulating layer 161 may be formed using a chemical vapor deposition (CVD) process or a spin coating process.

In an implementation, each of the first and second contact structures CS1 and CS2 may include a seed layer 182 and a contact plug 185 on the seed layer 182. The seed layers 182 may be on the gate electrode 145 and the source/drain regions 110, respectively.

In an implementation, the seed layer 182 may include a polycrystalline conductive material and may have a lower region 182a and an upper region 182b having different grain sizes (e.g., different average grain sizes). By changing a grain size in an upper region 182b of the seed layer 182, providing a deposition surface for a contact plug 185, and depositing a metal appropriately selected as the contact plug 185, a grain size may be increased to implement a low-resistance contact structure. In an implementation, by adjusting a grain size in an upper surfaced region of a contact plug 185, in which a conductive via VM is to be formed, and depositing a metal appropriately selected as an interconnection line 190, a low-resistance interconnection line may be implemented.

In addition, the semiconductor device 100 may include an interconnection line 190, connected to the first and second contact structures CS1 and CS2, on the first and second contact structures CS1 and CS2. The interconnection line 190 may include a portion of an interconnection such as a back end of line (BEOL).

First and second interlayer insulating layers 172 and 173 may be on the insulating structure 160. An etch-stop layer 171 may be between the insulating structure 160 (e.g., the capping insulating layer 162) and the first interlayer insulating layer 172. In an implementation, the etch-stop layer 171 may include a silicon nitride, a silicon carbonitride, an aluminum nitride, or an aluminum oxide. In an implementation, each of the first and second interlayer insulating layers 172 and 173 may include a silicon oxide, a silicon nitride, or a silicon oxynitride.

The interconnection line 190 according to the present embodiment may include metal lines ML, extending in the first direction (the X direction of FIG. 1), and contact vias VM between the first and second contact structures CS1 and CS2 and metal lines ML.

Hereinafter, a method of forming a low-resistance contact structure in a stack of the first and second contact structures CS1 and CS2 and the interconnection line 190 (e.g., the contact via VM) will be described in detail with reference to FIGS. 3 and 4.

Figure 3:
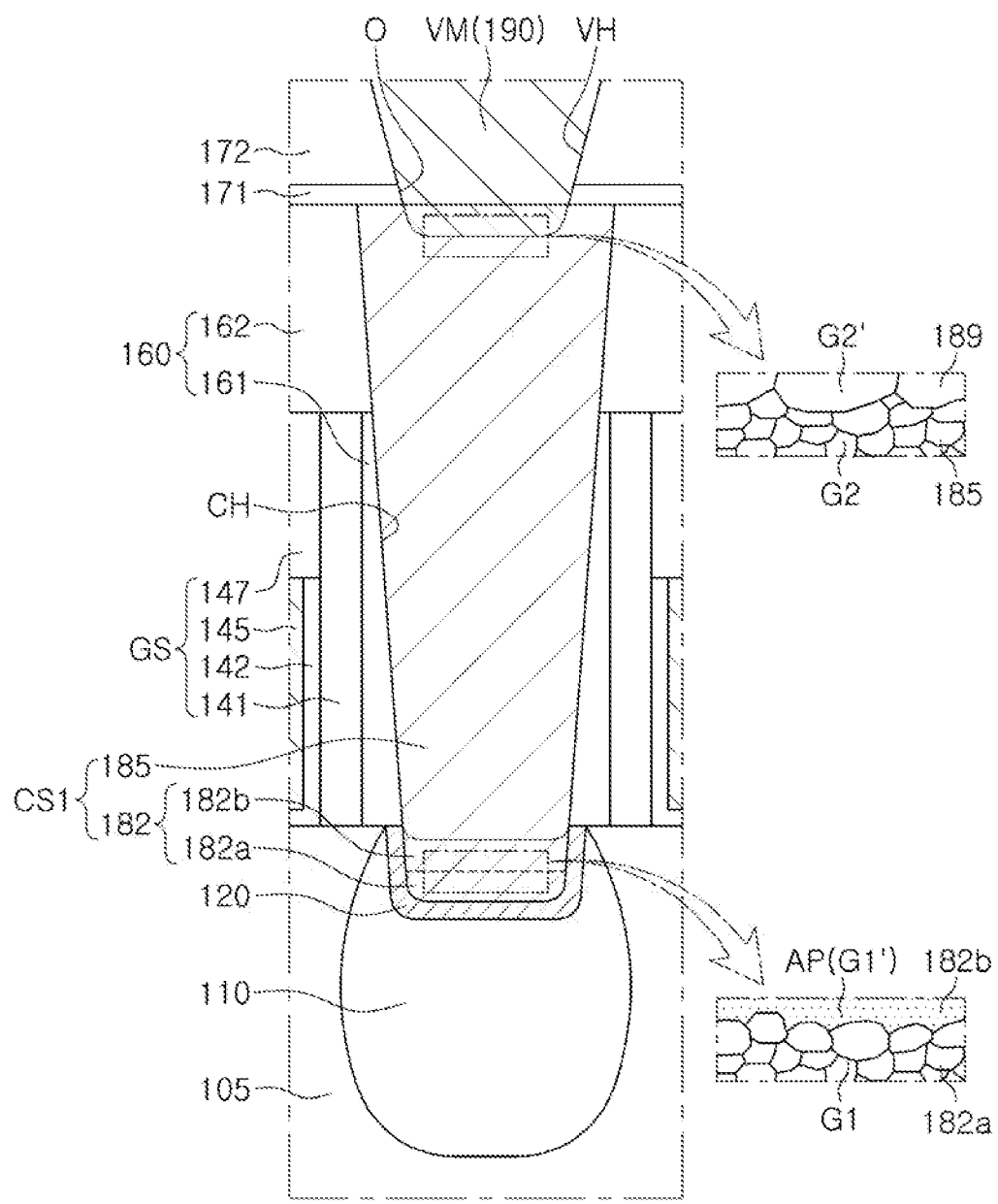
FIGS. 3 and 4 are enlarged views of portion "A1" and portion "A2" of the semiconductor device of FIGS. 2A and 2B, respectively.

FIG. 3 is an enlarged view of portion "A1" of the semiconductor device 100 illustrated in FIG. 2A.

Referring to FIG. 3, a metal silicide layer 120 may be on the source/drain regions 110. The metal silicide layer 120 may be along a recessed region 110R of the source/drain region 110. The metal silicide layer 120 may be a crystalline silicide layer. In an implementation, the metal silicide layer 120 may be a silicide layer containing Ti, W, Ru, Nb, Mo, Hf, Ni, Co, Pt, Yb, Tb, Dy, Er, Pd, or combinations thereof. In an implementation, the metal silicide layer 120 may include CoSi, NiSi, or TiSi.

In an implementation, the seed layer 182 may include a polycrystalline conductive material having different grain conditions in upper and lower regions thereof. The lower region 182a of the seed layer 182 may have a polycrystalline region including a first grain G1, and an upper region 182b of the seed layer 182 may have a polycrystalline structure including a grain G1' having a smaller size than the first grain G1, or may be amorphous AP or quasi-amorphous. The first grain G1, obtained when the seed layer 182 is grown, may be changed to a size-reduced grain G1' or changed to be substantially amorphous AP in the upper region 182b by an ion implantation process. In an implementation, the first grain G1 may be maintained at an original size thereof in the lower region 182a of the seed layer 182 without being affected by the ion implantation process.

In the present embodiment, a metal appropriately selected as a contact plug 185 may be deposited on the upper region 182b of the seed layer 182 (having been changed to the size-reduced grain G1' or changed to be amorphous AP), and thus, the contact plug 185 may include a second grain G2 having a sufficient size. A mean free path may be reduced due to the second grain G2, having a relatively large size, to provide a low-resistance contact plug 185. In an implementation, the grain G2 of the contact plug 185 may have a size of 7 nm or more, e.g., 10 nm or more. In an implementation, the contact plug 185 may be formed of molybdenum, and the contact plug 185 may be implemented to have resistivity of 50 $\mu\Omega$·cm or less, e.g., 10 $\mu\Omega$·cm or less, as a grain size (e.g., average grain size) is increased.

As illustrated in FIG. 3, the upper region 182b of the seed layer 182 may include a grain G1' having a smaller size than the lower region 182a or may be amorphous AP, and the contact plug 185 may include the second grain G2 having a relatively large size. In an implementation, the seed layer 182 may include a titanium nitride (TiN), a tantalum nitride (TaN), a titanium silicon nitride (TiSiN), a tungsten carbonitride (WCN), or a tungsten nitride (WN), and the contact plug 185 may include molybdenum (Mo), ruthenium (Ru), tungsten (W), or cobalt (Co). In an implementation, the seed layer 182 may include a titanium silicon nitride (TiSiN), and the contact plug 185 may include tungsten (W).

In an implementation, the seed layer 182 may be on the bottom of a first contact hole CH1 for the first contact structure CS1. The contact plug 185 may be in the first contact hole CH1 without a barrier layer. A sidewall of the contact plug 185 may be in direct contact with the insulating structure 160. The barrier layer having relatively high resistance may be omitted to reduce not only contact resistance between the contact plug 185 and the metal silicide layer 120 but also a size (e.g., a width) of the first contact structure CS1.

In an implementation, a bottom width W (e.g., in the X direction or the Y direction) of the first contact structure CS1 may be 20 nm or less, e.g., 15 nm or less. In an implementation, an aspect ratio of a height H (e.g., in the Z direction) to the bottom width W of the first contact structure CS1 may be 3:1 or more. In an implementation, the seed layer 182 may have a thickness (e.g., in the Z direction) of 5 nm or less. The seed layer 182 may be formed by a deposition process such as a physical vapor deposition (PVD) process.

Figure 4:
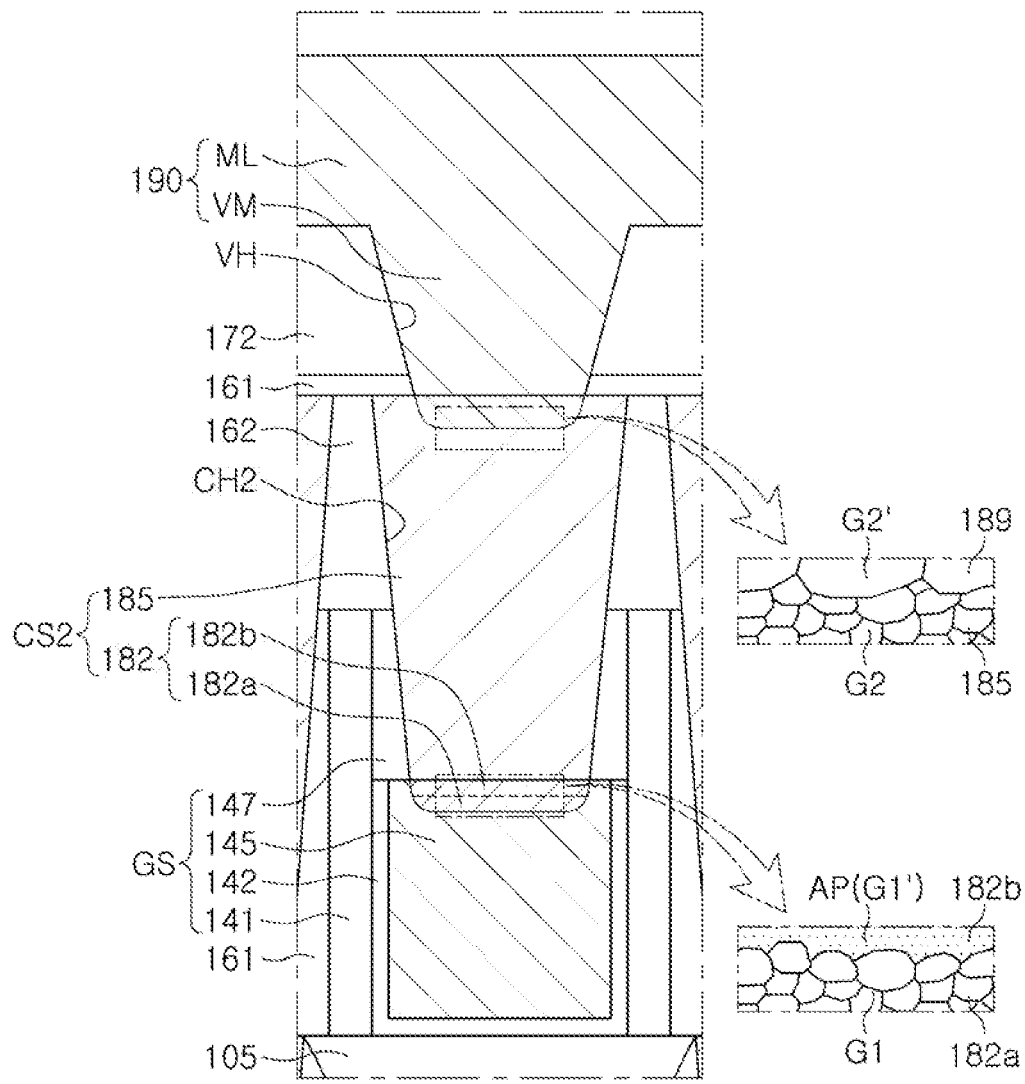

Referring to FIG. 4, the second contact structure CS2 (e.g., related to the gate structure GS) may be implemented as a low-resistance contact, similar to the first contact structure CS1. FIG. 4 is an enlarged view of portion "A2" of the semiconductor device 100 illustrated in FIG. 2B.

Similarly to the first contact structure CS1, the second contact structure CS2 illustrated in FIG. 4 may include a seed layer 182, on the gate electrode 145, and a contact plug 185 on the seed layer 182. The seed layer 182 may include a first conductive material, the lower region 182b may have a polycrystalline region including a first grain G1, and the upper region 182b may have a polycrystalline structure including a grain G1' (having a smaller size than the first grain G1), or may be amorphous AP or quasi-amorphous.

The contact plug 185 on the upper region 182b of the seed layer 182 may include a second grain G2 having a relatively large size. In an implementation, the seed layer 182 may include a titanium nitride (TiN), a tantalum nitride (TaN), a titanium silicon nitride (TiSiN), a tungsten carbonitride (WCN), or a tungsten nitride (WN), and the contact plug 185 may include molybdenum (Mo), ruthenium (Ru), tungsten (W), or cobalt (Co). In an implementation, the seed layer 182 may include a titanium silicon nitride (TiSiN), and the contact plug 185 may include tungsten (W).

Referring to FIGS. 3 and 4, the interconnection lines 190 on the first and second contact structures CS1 and CS2 may be in or on a grain adjustment region 189 on an upper surface of the contact plug 185.

An ion implantation process and an annealing process may be applied to the upper surface of the contact plug 185, e.g., a contact region, to change a size of the second grain G2 of the contact plug 185, and thus, the grain adjustment region 189 may be formed. In an implementation, the grain adjustment region 189 may include a grain G2' having a larger size than the second grain G2. A metal for the interconnection line 190, deposited on the grain adjustment region 189, may include a second grain G2 having a sufficient size. As a result, a low-resistance interconnection structure may be provided. In an implementation, the interconnection line 190 may include molybdenum (Mo), ruthenium (Ru), tungsten (W), cobalt (Co), or copper (Cu). In an implementation, the contact plug 185 may include tungsten (W), and the interconnection line 190 (e.g., the contact via VM) may include molybdenum (Mo).

As described above, the grain size (e.g., average grain size) of the lower layers (e.g., an upper surface region of the seed layer 182 or the contact plug 185) may be changed to increase not only grains of the contact plug 185 but also grains of the interconnection line 190 (e.g., the contact via VM). Thus, a low-resistance contact structure may be implemented.

In addition, a determination may be selectively made as to whether to increase a grain size (e.g., average grain size) depending on surface energy and grain boundary energy of a lower layer, a grain adjustment target, and the polycrystalline conductive material to be deposited on the lower layer, or to reduce a grain size (e.g., average grain size) to be amorphous or similarly to an amorphous material.

In an implementation, the seed layer 182 may be deposited as a titanium silicon nitride (TiSiN), and a grain size (e.g., average grain size) thereof may be reduced, similarly to an amorphous material, or an upper portion of the seed layer 182 may be changed to be amorphous. Then, a contact plug 185 may be deposited on the changed upper portion of the seed layer 182 using tungsten (W) to form a low-resistance contact plug. In an implementation, a grain size may be increased in a contact region of the contact plug 185, formed of tungsten (W), to form a grain adjustment region 189, and an interconnection line 190 may be formed on the grain adjustment region (e.g., a contact via VM) using molybdenum (Mo). In an implementation, not only a size of the contact plug 185 but also a size of the interconnection line 190 (e.g., the contact via VM) may be increased to form a low-resistance contact.

Hereinafter, a process of forming a first contact structure in the above-described semiconductor device 100 will be described in detail with reference to FIGS. 5A to 5E. For ease of description, cross-sectional views of the drawings illustrate enlarge portion "A1" of FIG. 2A, as illustrated in FIG. 3. Some components of the present embodiment are somewhat briefly illustrated, but will be understood with reference to the descriptions of the same or similar components of the embodiments illustrated in FIGS. 1 to 4, unless otherwise specified.

Figures 5A, 5B, 5C:
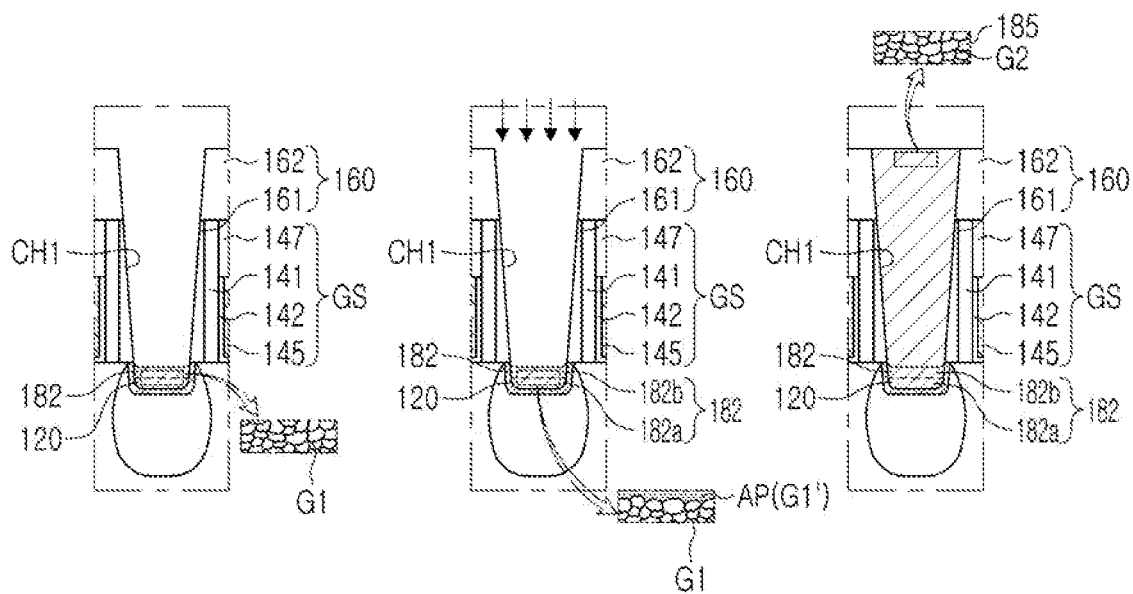
FIGS. 5A to 5E are cross-sectional views of stages in a method of manufacturing a semiconductor device according to an example embodiment.

Referring to FIG. 5A, the seed layer 182 may be formed on the metal silicide layer 120 on or at a bottom surface of the first contact hole CH1.

The intergate insulating layer 161 and the capping insulating layer 162 may be successively etched using an etching mask to form a first contact hole CH1. A certain region of the source/drain region 110 may be exposed through the first contact hole CH1. The certain region of the source/drain region 110, exposed during formation of the first contact hole CH1, may be recessed to a predetermined depth. In an implementation, a second contact hole CH2 for a second contact structure may also be formed. A metal layer may be formed in the recessed region of the source/drain regions, exposed by the first contact hole CH1, and an annealing process may be performed to form a metal silicide layer 120 in the exposed region of the source/drain regions 110.

A seed layer 182 may be formed of a polycrystalline conductive material on the metal silicide layer 120. The seed layer may include a first grain G1 having a substantially uniform first size. The seed layer 182 may be formed by a straightforward deposition process such as a physical vapor deposition (PVD) process. The seed layer 182 may be formed on the bottom of the desired first contact hole CH1 by such a straightforward deposition process. In an implementation, the seed layer 182 may be formed to have a thickness of 5 nm or less, e.g., 3 nm or less. In an implementation, the seed layer 182 may include a titanium nitride (TiN), a tantalum nitride (TaN), a titanium silicon nitride (TiSiN), a tungsten carbonitride (WCN), or a tungsten nitride (WN).

Referring to FIG. 5B, an ion implantation process may be applied to the seed layer 182 to change a size of the first grain G1 in the upper region 128b of the seed layer 182.

The ion implantation process may be applied to the seed layer 182 to change the first grain G1 into a size-reduced grain G1' or to be substantially amorphous AP in the upper region 182b of the seed layer. Energy may be adjusted such that ions are prevented from being implanted into the lower regions 182a of the seed layer 182 to have no disadvantageous effect on other components below the seed layer 182, or a contact between the seed layer 182 and the metal silicide layer 120 in the ion implantation process. As a result, an original size of the first grain G1 may be maintained in the lower region 182a of the seed layer 182. As described above, the lower region 182a of the seed layer 182 may have a polycrystalline region including the first grain G1, and the upper region 182b of the seed layer 182 may have a polycrystalline structure including a grain size G1' (e.g., average grain size) having a smaller (e.g., average) size than the first grain G1, or may be amorphous AP or quasi-amorphous.

The ion implantation process may be performed using various suitable elements in an inert gas atmosphere. The ion implantation process may be performed by selecting an element having an appropriate size according to a conductive material, a grain adjustment target, and a suitable element that does not cause an unwanted chemical reaction with the conductive material may be used.

In the present embodiment, a description has been provided of a case in which a grain size is reduced, similarly to an amorphous material, or to be amorphized by ion implantation. In an implementation, the grain size (e.g., average grain size) may be increased using an ion implantation process according to surface energy and grain boundary energy of a lower material, a grain adjustment target, and a polycrystalline conductive material to be deposited on the lower material (see FIG. 5B).

Referring to FIG. 5C, a contact plug 185 may be formed using the seed layer 182 to fill the first contact hole CH1.

In the present process, a metal material layer for the contact plug 185 may be formed to cover an upper surface of the insulating structure 160 while filling the first contact hole CH1, and a planarization process such as a chemical mechanical polishing (CMP) process may be performed to expose an upper surface of the capping insulating layer 162. Due to such a polishing process, the contact plug 185 may have an upper surface, substantially coplanar with an upper surface of the insulating structure 160.

The contact plug 185 may include a second grain G2, having a relatively large size, on the seed layer 182. In an implementation 1e, the contact plug 185 may include a metal such as molybdenum (Mo), ruthenium (Ru), tungsten (W), cobalt (Co), or copper (Cu). In an implementation, when the seed layer 182 includes titanium a silicon nitride (TiSiN), the contact plug may include tungsten (W).

In the present embodiment, a metal material layer may be provided in the first contact hole CH1 without a barrier layer. Due to omission of the barrier layer having relatively high resistance, not only the contact resistance between the contact plug 185 and the metal silicide layer 120 but also a size of the contact structure may be reduced. In addition, the contact plug 185 may be in direct contact with the insulating structure 160 on an internal sidewall of the first contact hole CH1.

Figures 5D, 5E:
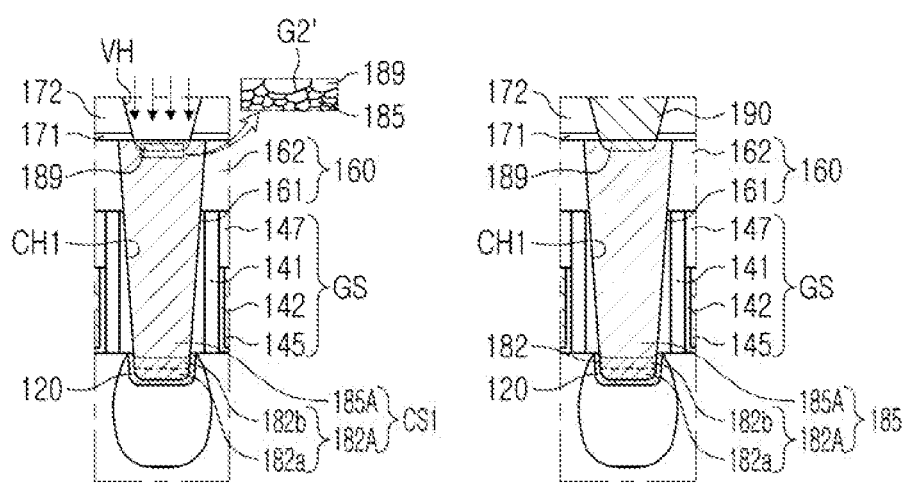

Referring to FIG. 5D, an interlayer insulating layer 172 may be formed on the insulating structure 160, and a grain adjustment region 189 may be formed in the contact region of the contact plug 185.

An etch-stop layer 171 and the interlayer insulating layer 172 may be formed on the insulating structure 160, and a via hole VH may be formed in the interlayer insulating layer 172 using the etch-stop layer. A certain region of an upper surface of the contact plug 185 may be exposed to the contact region through the via hole VH. In an implementation, an ion implantation process may be applied to the exposed contact region of the contact plug 185 to form a grain adjustment region 189. The grain adjustment region 189 may include a grain G2' having a size different from a size of the second grain G2 in another region of the contact plug. In an implementation, the changed grain G2' may have a larger size than the size of the second grain G2. When the grain size is increased, an annealing process may be additionally performed after the ion implantation process is performed. In an implementation, when the contact plug 185 includes tungsten (W), the grain of the grain adjustment region may have a size increased by the ion implantation process.

Referring to FIG. 5E, an interconnection line 190, having the contact via VM on the grain adjustment region 189, may be formed.

In an implementation, the interconnection line 190 may have the contact via VM deposited from the grain adjustment region 189 of the contact plug 185. The interconnection line 190 (e.g., the contact via VM), deposited on the grain adjustment region 189, may include a grain having a relatively large size. In an implementation, the interconnection line 190 (e.g., the contact via VM) may be formed on the grain adjustment region of the contact plug 185 using molybdenum (Mo) to increase a grain size, and thus, a low-resistance interconnection line may be provided.

As described above, a grain size of lower layers (e.g., an upper region of the seed layer 182 or the contact plug 185) may be changed to increase not only grains of the contact plug 185 but also grains of the interconnection line 190 (e.g., the contact via VM), and thus, a low-resistance contact structure may be implemented. In an implementation, the process of forming the grain adjustment region may be changed, and then performed.

Figure 6A:
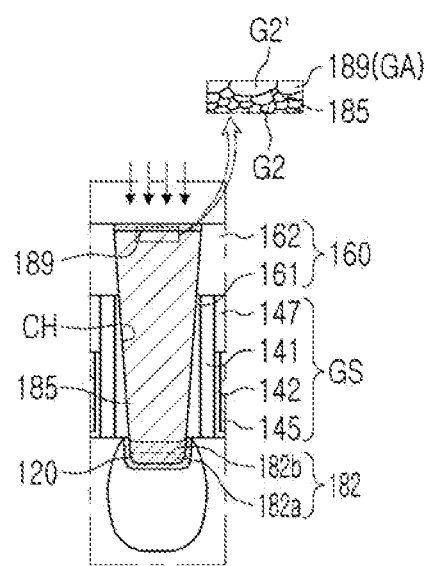
FIGS. 6A and 6B are cross-sectional views of stages in a method of manufacturing a semiconductor device according to an example embodiment.
Figure 6B:
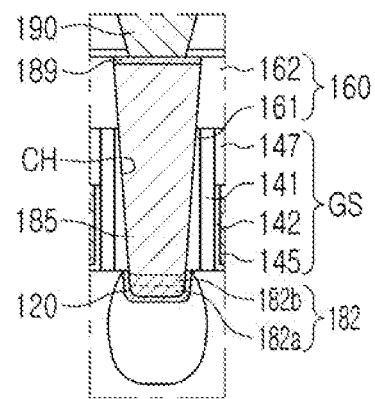

FIGS. 6A and 6B are cross-sectional views of stages in a method of forming a grain adjustment region, among main processes of a method of manufacturing a semiconductor device according to another example embodiment. It will be understood that the present processes are subsequent to the process of FIG. 5C.

Referring to FIG. 6A, a grain adjustment region 189 may be formed in a contact region of a contact plug 185 using an ion implantation process.

In the present process, an ion implantation process may be applied to an upper surface of the contact plug 185 to form the grain adjustment region 189. In an implementation, the ion implantation process may be performed before an interlayer insulating layer 172 is formed, and the grain adjustment region 189 may be formed on an entire upper surface of the contact plug 185. In an implementation, a changed grain G2' may have a size larger size than a second grain G2. When a grain size is increased, an annealing process may be additionally performed after the ion implantation process is performed.

Referring to FIG. 6B, an interlayer insulating layer 172 may be formed on an insulating structure 160 and an interconnection line 190, having a contact via VM on the grain adjustment region 189, may be formed.

An etch-stop layer 171 and the interlayer insulating layer 172 may be formed on the insulating structure 160, and a via hole VH may be formed in the interlayer insulating layer 172 using the etch-stop layer. An upper surface of the contact plug 185, e.g., a portion of the grain adjustment area 189 may be exposed through the via hole VH.

In an implementation, the interconnection line 190 may have a contact via VM deposited from the grain adjustment region 189 of the contact plug 185. The interconnection line 190 (e.g., the contact via VM), deposited on the grain adjustment region 189, may be formed to include a grain having a relatively large size.

Contact structures, employable in the semiconductor device according to the present embodiment, may be changed in various forms. In an implementation, a region in which a seed layer is formed may vary depending on a deposition process, and various combinations of the seed layer and a contact metal may be implemented in a stack of a contact structure.

Figure 7:
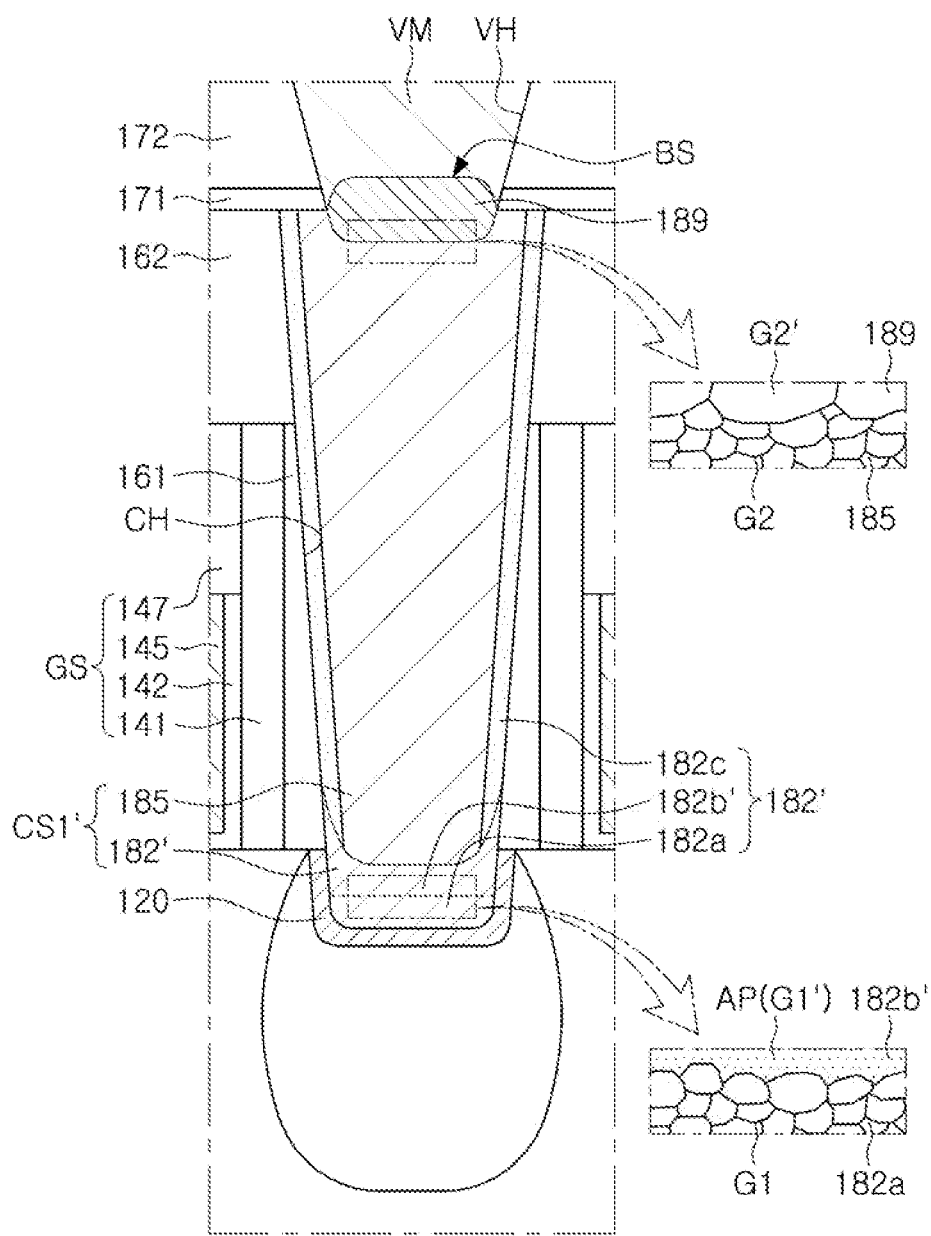
FIGS. 7 and 8 are cross-sectional views of contact structures employable in semiconductor devices according to various embodiments.
Figure 8:
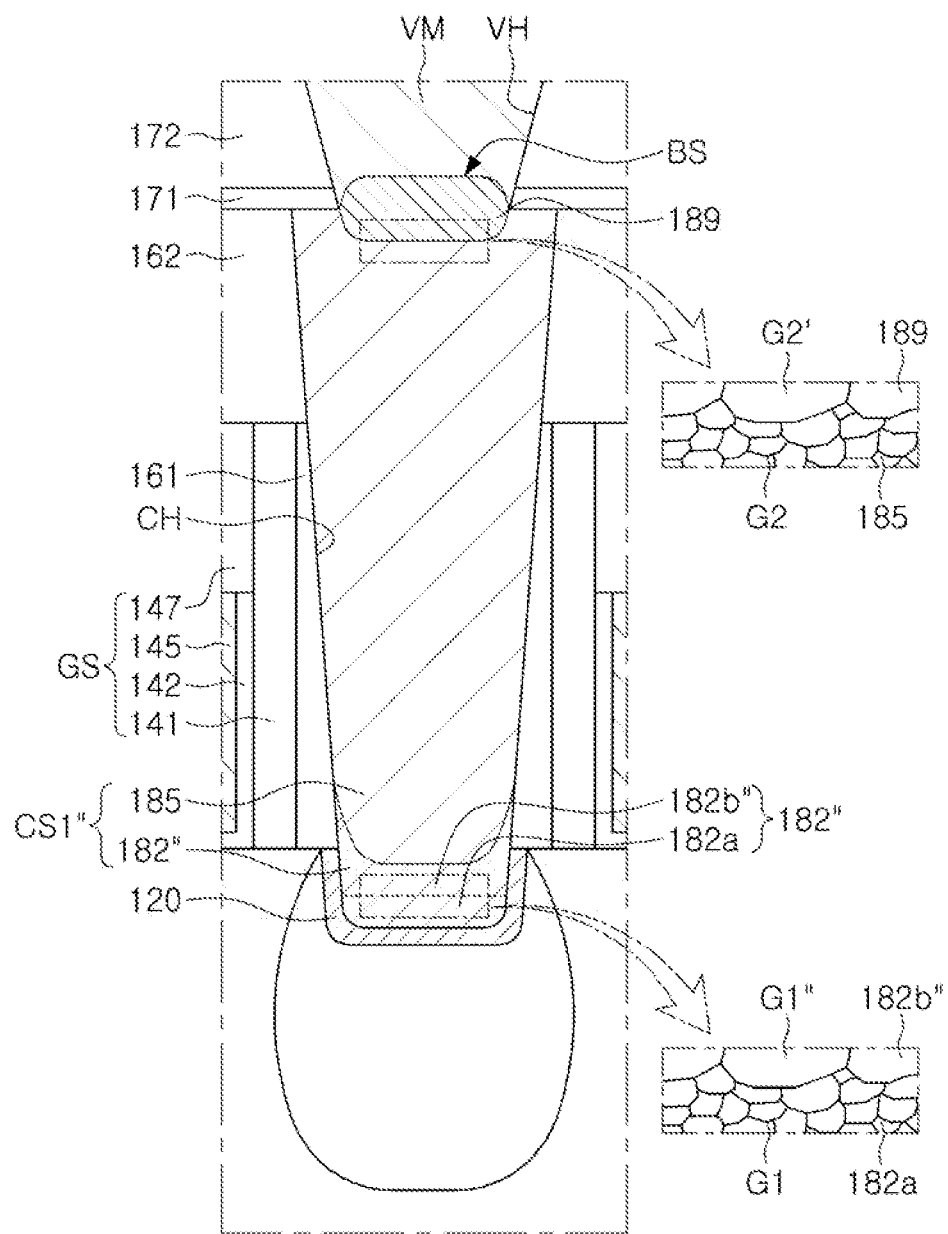

FIGS. 7 and 8 are cross-sectional views of a contact structure employable in a semiconductor device according to various example embodiments. It will be understood that the cross-sectional views are an enlarged view of portion "A1" of FIG. 2A, as illustrated in FIG. 3.

It will be understood that a first contact structure CS1' illustrated in FIG. 7 are similar to the contact structure CS1 illustrated in FIG. 3, except that the first contact structure CS1' has a portion 182*c*, in which the seed layer 182 extends along an internal sidewall of a contact hole CH, and a grain adjustment region 189 has a convex surface BS. In addition, components of the present embodiment may be understood with reference to the descriptions of the same or similar components of the embodiment illustrated in FIGS. 1 to 4 (especially, FIG. 3), unless otherwise specified.

Similarly to the previous embodiment, the seed layer 182' may have a lower region 182*a*, on a metal silicide layer 120 and including a first polycrystalline conductive material including a first grain G1, and an upper region 182*b*' including a grain G1' having a smaller size than the first grain G1 or an amorphous upper region. The seed layer 182', employed in the present embodiment, may have a portion 182*c* partially extending to not only a bottom of the contact hole CH but also an internal sidewall of the contact hole CH. Unlike other portions 182*a* grown from the crystalline metal silicide layer 120, the extending portion 182*c* of the seed layer 182' may include an amorphous portion.

The grain adjustment region 189 may be defined by a via hole VH, and an upper surface of a contact plug 185 may include a first region, provided as the grain adjustment region 189, and a first region formed around the first region (see the processes of FIGS. 5D and 5E). In an implementation, the second region may have a surface substantially coplanar with a surface of a capping insulating layer 162, while the grain adjustment region 189 may have a non-planar surface. In an implementation, as illustrated in FIG. 7, the grain adjustment region 189 may include a second grain G2' having a larger size than the second grain G2, and the first region, e.g., the grain adjustment region 189 may have a convex surface BS.

It will be understood that a first contact structure CS1" illustrated in FIG. 8 is similar to the first contact structure CS1 illustrated in FIG. 1, except that a portion of the seed layer 182" extends to the internal sidewall of the contact hole CH and the upper region 182*b*" includes a grain G1 having an increased size and, similarly to the previous embodiment, the grain adjustment region 189 has a convex surface BS. In addition, components of the present embodiment may be understood with reference to the descriptions of the same or similar components of the embodiment illustrated in FIGS. 1 to 4 (especially, FIG. 3), unless otherwise specified.

An upper region 182*b*" of the seed layer 182" may partially extend to the internal sidewall of the contact hole CH, and may have a polycrystalline portion grown from the metal silicide film 120. In an implementation, the seed layer 182" may include a lower region 182*a*, including a first grain G1 on the metal silicide layer 120, and the upper region 182*b*" including a grain G1" having a larger size than the first grain G1. An annealing process may be performed, together with an ion implantation process, to form the grain G1" having such an increased size.

In an implementation, the seed layer 182" may include tungsten (W), and the contact plug 189 may include molybdenum (Mo). The contact plug 189, including molybdenum (Mo), may also provide a grain adjustment region 189 including a grain G2' having an increased size in a contact region by the ion implantation process to form an interconnection line 190 including molybdenum (Mo), and thus, not only a low-resistance contact plug 185 but also a low-resistance interconnection line 190 may be formed.

In an implementation, in the contact stack structure illustrated in FIG. 8, the grain size may be reduced, similarly to an amorphous material, or an amorphized grain adjustment region may be formed in the contact region of the contact plug 185, and an interconnection line having an increased grain size may be formed on the grain adjustment region using another metal material.

The above-described interconnection line 190 may be advantageously applied to another type of semiconductor device. In an implementation, a fin-type transistor (FinFET) having a fin-type channel region, as illustrated in FIGS. 2A to 2C, may be used in a semiconductor device. A semiconductor device according to some embodiments may include a tunneling field effect transistor (a tunneling FET), a transistor including a nanowire, a transistor including a nanosheet (for example, Multi-Bridge Channel FET (MBCFET™)), or various three-dimensional (3D) transistors.

Figure 9:
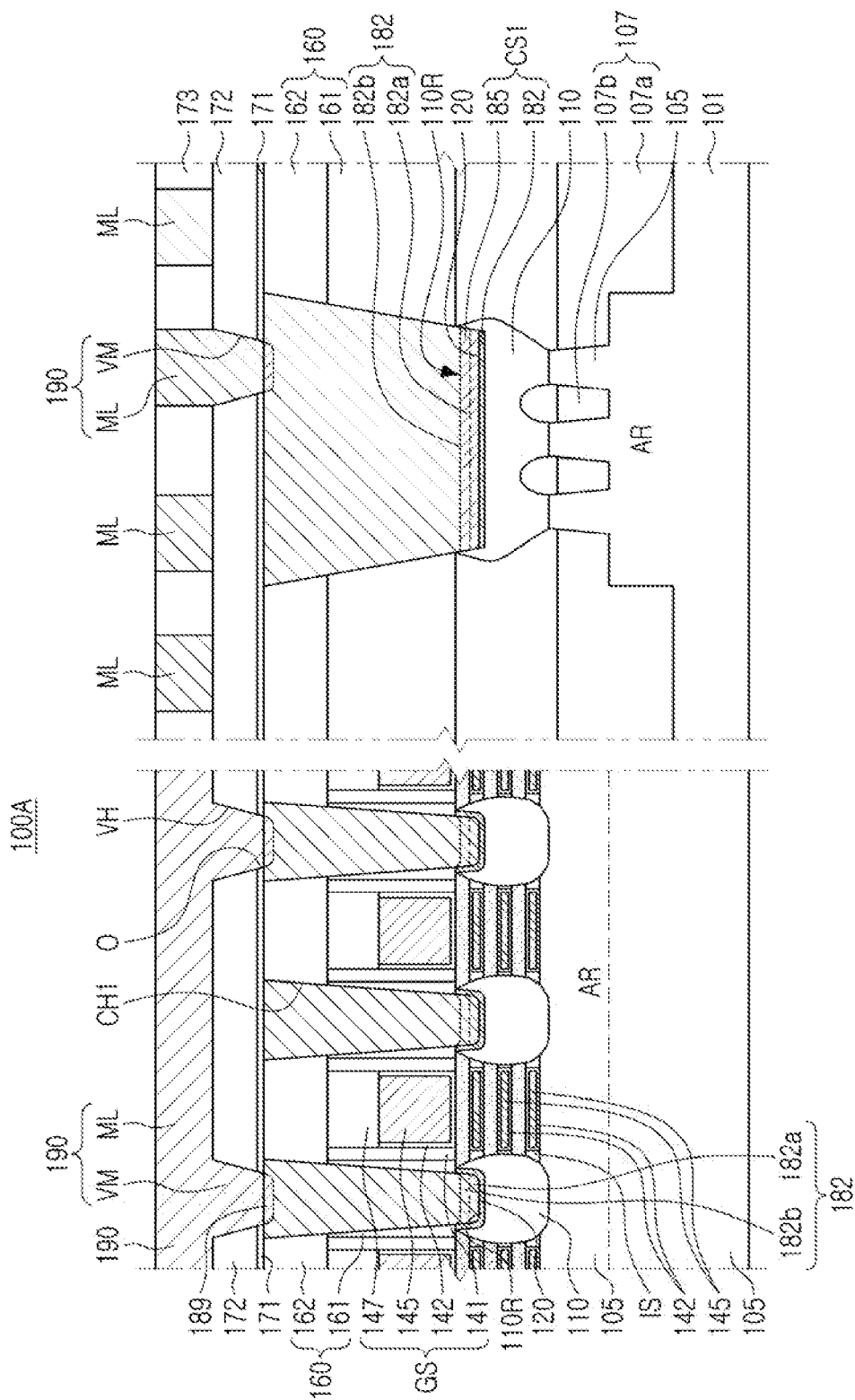
FIG. 9 is a cross-sectional view of a semiconductor device according to an example embodiment.

FIG. 9 illustrates cross-sectional views of a transistor (e.g., an N-MOSFET), including a nanosheet, as a semiconductor device 100A according to an example embodiment.

Referring to FIG. 9, it will be understood that the semiconductor device 100A is similar to the semiconductor device described with reference to FIGS. 1 to 4, except that a structure corresponding to the fin-type active region 105 of the previous embodiment is implemented as a multichannel structure using nanosheets. In addition, components of the present embodiment may be understood with reference to the descriptions of the same or similar components of the embodiment illustrated in FIGS. 1 to 4, unless otherwise specified.

As illustrated in FIG. 9, the semiconductor device 100A may include a plurality of channel layers CH and a gate electrode 145. The channel layers CH may be spaced apart from each other on an active region AR in a third direction (the Z direction of FIG. 1), perpendicular to an upper surface of a substrate 101. Each of the channel layers CH may have a nanosheet structure. The gate electrode 145 may surround the channel layers CH and may extend in a second direction (the Y direction of FIG. 1), intersecting the first direction (the Z direction of FIG. 1). The gate electrode 145, employed in the present embodiment, may be between gate spacers 141 as well as between the channel layers CH.

The semiconductor device 100A may include source/drain regions 110 in the active regions AR, on opposite sides adjacent to the gate electrode 145, to be connected to the channel layers CH. In an implementation, the source/drain regions 110 may be in fin-type active regions 105 on opposite sides adjacent to the gate electrode 145, and may be connected to both sides of the channel layers CH in the first direction (e.g., the X direction), respectively. In an implementation, as illustrated in the drawings, three channel layers CH may be present. The channel layers CH may include semiconductor patterns. In an implementation, the semiconductor patterns may include silicon (Si), silicon germanium (SiGe), or germanium (Ge).

The source/drain region 110 may include an epitaxial region regrown using the channel layers CH and the active region AR as seeds. In an implementation, the source/drain regions 110 may be formed of silicon (Si), and may be doped with N-type impurities such as phosphorus (P), nitrogen (N), arsenic (As), antimony (Sb), or the like.

The semiconductor device 100A may include internal spacers IS between each of the source/drain regions 110 and the gate electrode 14. The internal spacers IS may be on one side of the gate electrode 145. The internal spacers IS and the channel layers CH may be alternately disposed in the third direction. Each of the source/drain regions 110 may be in contact with the channel layer CH and may be spaced apart from the gate electrode 145 with the internal spacers IS therebetween. The gate insulating layer 142 may be between the gate electrode 145 and each of the channel layers CH, and may extend between the gate electrode 145 and each of the internal spacers IS.

The source/drain regions 110 may include three merged regrown epitaxial regions, and a recess R may be formed on an upper surface of the source/drain region 110 connected to a contact hole. A metal silicide layer 120 may be disposed along a surface of the recess R of the source/drain regions 110. A first contact structure CS1 may include a seed layer 182, on the metal silicide layer 120, and a contact plug 185 on the seed layer 182.

Each of the seed layer 182 and the contact plug 185, employed in the present embodiment, may include a polycrystalline metal. The seed layer 182 and the contact plug 185 may include a first crystalline metal and a second crystalline metal, respectively.

The seed layer 182 may include a lower region 182a, a polycrystalline region having a first grain size, and an upper region 182b disposed on the upper region 182b and having a size different from the first grain size. In an implementation, the upper region 182b of the seed layer 182 may have a size larger than the first grain size or a size smaller than the first grain size, or may be an amorphous region. A contact plug 185 may be formed of a second grain, having a relatively large size, on the upper region 182b by appropriately selecting a conductive material of the contact plug 185. In an implementation, the second contact structure connected to the gate electrode 145 may also be implemented as a low-resistance contact, similarly to the first contact structure CS1.

In an implementation, similarly to the upper region 182b of the seed layer 182, a grain adjustment region 189 may be formed in a contact region of an upper surface of the first contact structure CS1. Thus, an interconnection line 190 may also be similarly formed of a third grain having a relatively large size.

As described above, a grain size of lower layers (an upper surface region of the seed layer 182 or the contact plug 185) may be changed to increase not only grains of the contact plug 185 but also grains of the interconnection line 190 (e.g., a contact via VM). Thus, a low-resistance contact structure may be implemented.

Figure 10:
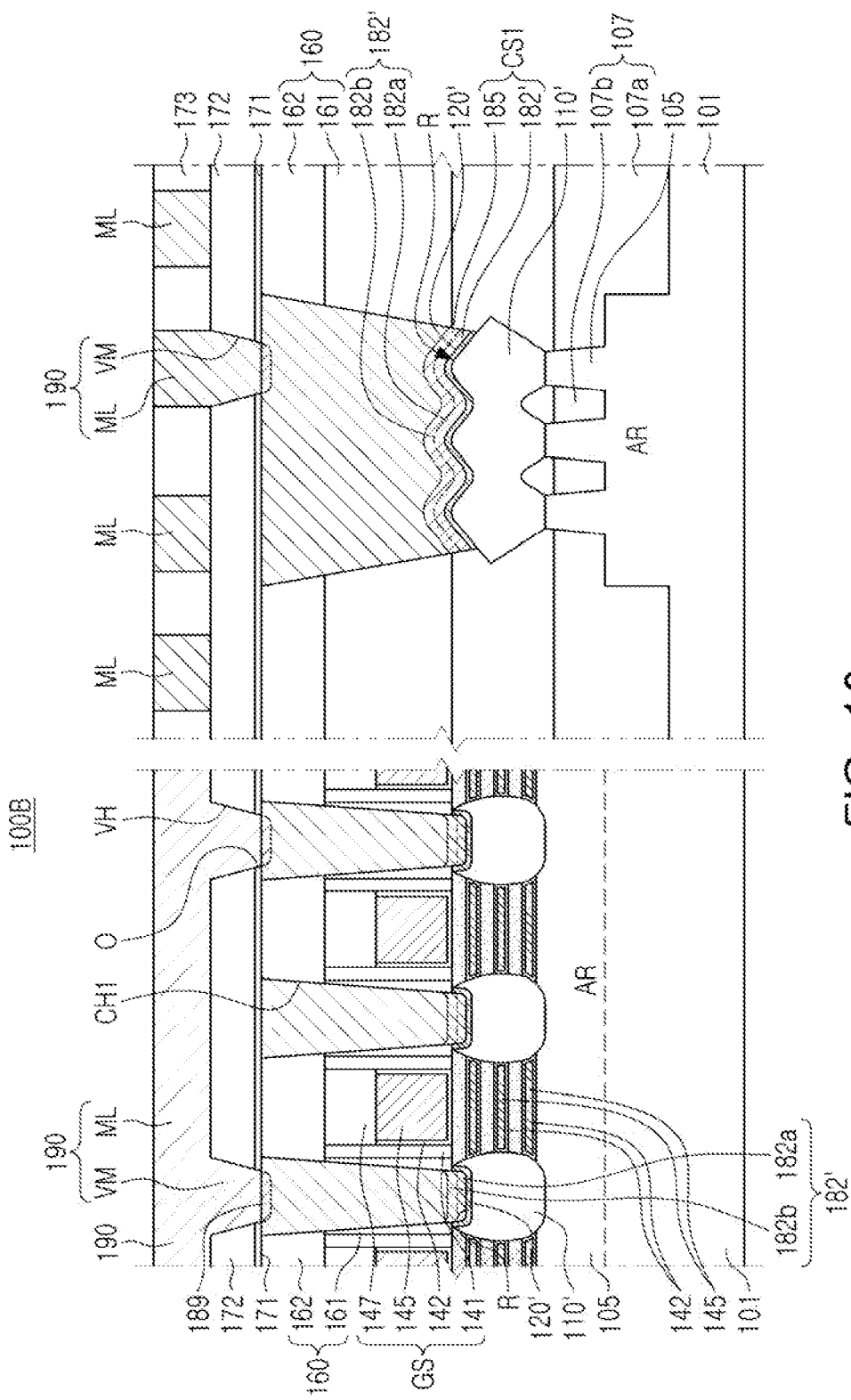
FIG. 10 is a cross-sectional view of a semiconductor device according to an example embodiment.

FIG. 10 illustrates cross-sectional views of a transistor (e.g., a P-MOSFET), including a nanosheet, as a semiconductor device 100B according to an example embodiment.

Referring to FIG. 10, the semiconductor device 100B may have a multichannel structure using nanosheets, similarly to the example embodiment illustrated in FIG. 9, and may be implemented as a P-MOSFET, unlike the example embodiment illustrated in FIG. 9. Similarly to the previous embodiment, it will be understood that the semiconductor device 100B according to the present embodiment is similar to the semiconductor devices described in FIGS. 1 to 4 and FIG. 9. In addition, components of the present embodiment may be understood with reference to the descriptions of the same or similar components of the embodiment illustrated in FIGS. 1 to 4 and FIG. 9, unless otherwise specified.

Referring to FIG. 10, similarly to the previous embodiment (FIG. 8), the semiconductor device 100B according to the present embodiment may include a plurality of channels CH and a gate electrode 145. The channel layers CH may be spaced apart from each other on an active region AR in a third direction (the Z direction of FIG. 1), perpendicular to an upper surface of a substrate 101. Each of the channel layers CH may have a nanosheet structure. The gate electrode 145 may surround the channel layers CH and may extend in a second direction (the Y direction of FIG. 1), intersecting the first direction (the Z direction of FIG. 1). The gate electrode 145 may be between gate spacers 141 as well as between the channel layers CH.

The semiconductor device 100B may include a source/drain region 110' connected to a plurality of channel layers CH on opposite sides adjacent to the gate electrode 145. The source/drain regions 110' may be in fin-type active regions 105 on opposite sides adjacent to the gate electrode 145, and may be connected to both sides of the channel layers CH in a first direction (e.g., an X direction), respectively. The source/drain regions 110' may include an epitaxial layer formed using the channel layers CH and the active region AR as seeds. Unlike the previous embodiment (FIG. 9), the source/drain regions 110' employed in the present embodiment may be formed of silicon-germanium (SiGe), and may be doped with P-type impurities such as boron (B), indium (In), gallium (Ga), boron trifluoride ($BF_3$), or the like.

Unlike the previous embodiment, in the semiconductor device 100B according to the present embodiment, the source/drain regions 110' and the gate insulating layer 142 may be in direct contact with each other without internal spacers IS.

The source/drain region 110' may include three merged regrown epitaxial regions (a Y-cut cross section may be pentagonal), and a metal silicide layer 120' may be formed on a curved crystal surface of the source/drain region 110'. A first contact structure CS1 may include a seed layer 182', disposed on the metal silicide layer 120', and a contact plug 185 disposed on the seed layer 182'.

Similarly to the previous embodiments, each of the seed layer 182' and the contact plug 185 employed in the present embodiment may include a polycrystalline metal. The seed layer 182' may have a lower region 182a, a polycrystalline region having a first grain size, and an upper region 182b on the lower region 182a and having a size different from the first grain size. In an implementation, the upper region 182b of the seed layer 182' may have a size larger than the first grain size, a size smaller than the first grain size, or may be an amorphous region. A contact plug 185 may be formed of a second grain, having a relatively large size, on the upper region 182b by appropriately selecting a conductive material of the contact plug 185. Due to such an increase in grain size, a low-resistance contact plug 185 may be provided. Similarly to the first contact structure CS1, a second contact structure connected to a gate electrode may also be implemented as a low-resistance contact.

In an implementation, similarly to the upper region 182b of the seed layer 182', a grain adjustment region 189 may be formed in a contact region of an upper surface of the first contact structure CS1. Thus, an interconnection line 190 may also be similarly formed of a third grain having a relatively large size.

As described above, a grain size of lower layers (an upper surface region of the seed layer 182' or the contact plug 185) may be changed to increase not only grains of the contact plug 185 but also grains of the interconnection line 190 (e.g., a contact via VM). Thus, a low-resistance contact structure may be implemented.

Figure 11:
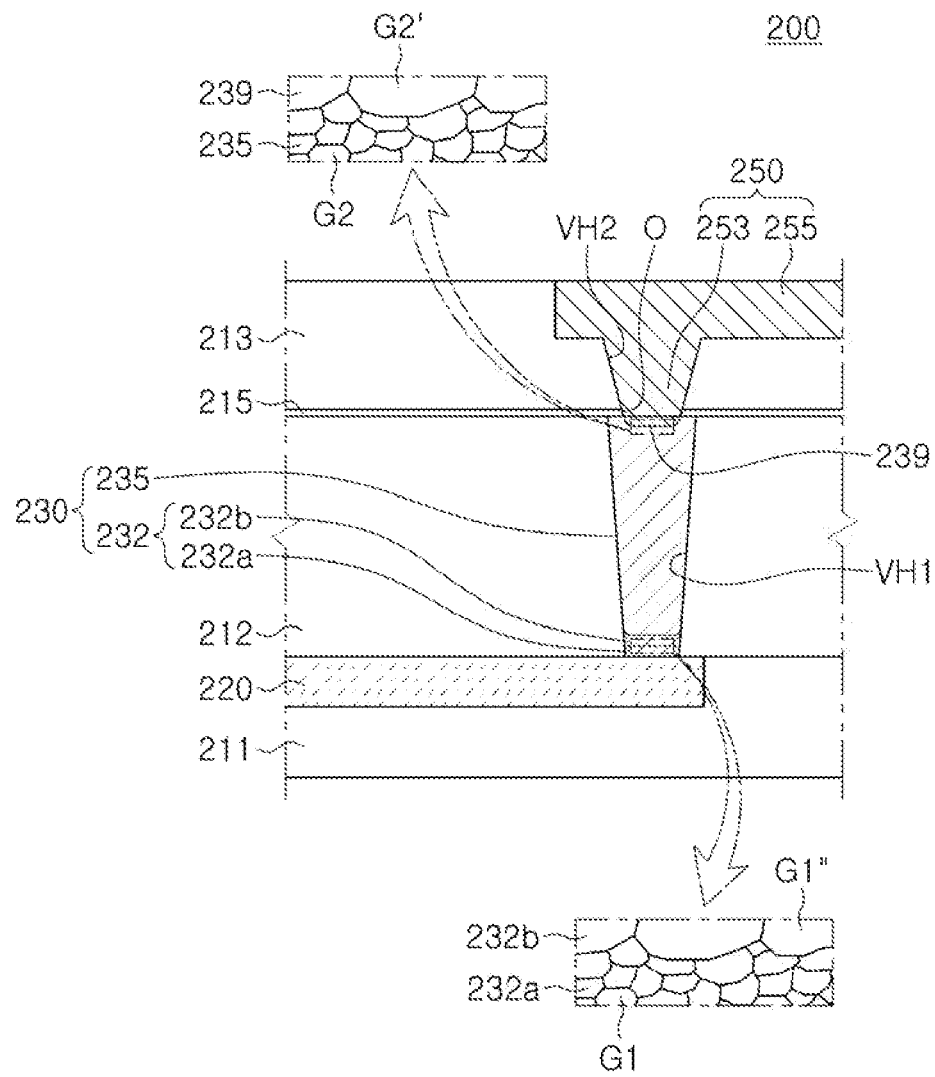
FIG. 11 is a cross-sectional view of a semiconductor device according to an example embodiment.

FIG. 11 is a cross-sectional view of a semiconductor device 200 according to an example embodiment.

The semiconductor device 200, illustrated in FIG. 11, may include a substrate 211 having a contact region, a first interlayer insulating layer 212 on the substrate 211 and having a first contact hole VH1 connected to a contact region CA, and a contact structure 230 on the contact region CA within the first contact hole VH1.

The contact structure 230 may include a first seed layer 232, including a first polycrystalline conductive material, and a first contact via 235 on the first seed layer 232 to fill the first contact hole VH1 and including a second polycrystalline conductive material. In an implementation, as illustrated in the drawings, the contact region CA may be a certain region of a conductive line 220, or may be an active region such as a source/drain region or a metal silicide layer, similarly to the previous embodiment.

The first seed layer 232 may include a first polycrystalline conductive material, and may have a lower region 232a, including a first grain G1 on the contact region CA in the first contact hole VH1, and an upper region 232b including a grain G1' having a larger size than the first grain G1. The first contact via 235 may include a second polycrystalline conductive material as a second grain G2 filling the first contact hole VH1 on the upper region 182b of the seed layer 182 and having a relatively large size.

The semiconductor device 200 according to the present embodiment may include an etch-stop layer 215 on the first interlayer insulating layer 212, a second interlayer insulating layer 213 on the etch-stop layer 215 and having a second contact hole VH2 connected to the contact structure 230, and an interconnection line 250 on the second interlayer insulating layer 213 and connected to the contact structure 230. The interconnection line 250 may have a contact via 253, connected to the contact structure 230 through the second contact hole VH2, and a conductive line 255 connected to the contact via 253.

The first contact via 235 may have a grain adjustment region 239 including a grain G2', having a larger size than the second grain G2, in a region defined by the second contact hole VH2. The second contact via 253 may be on the grain adjustment region 239 and may include a third polycrystalline conductive material filling the second contact hole VH2. The second contact via 253 may be formed of a third grain having a relatively large size.

In an implementation, as illustrated in the drawings, the upper region 232b of the seed layer 232 and the grain adjustment region 239 may have an increased grain size. In an implementation, at least one of the upper region 232b of the seed layer 232 and the grain adjustment region 239 may have a reduced grain size, similarly to an amorphous material, or may be provided as an amorphous region.

In an implementation, the seed layer 232 may include tungsten (W), a titanium nitride (TiN), a tantalum nitride (TaN), a titanium silicon nitride (TiSiN), a tungsten carbonitride (WCN), or a tungsten nitride (WN). The first contact via 235 may include molybdenum (Mo), ruthenium (Ru), tungsten (W), or cobalt (Co). The interconnection line 250, having the second contact via 253, may include molybdenum (Mo), ruthenium (Ru), tungsten (W), cobalt (Co), or copper (Cu).

As described above, a grain size of lower layers (e.g., an upper surface area of the seed layer 232 or the first contact via 235) may be changed to increase not only grains of the first contact via 235 but also grains of the interconnection line 250 (e.g., the second contact via 253) and to help decrease electrical resistance of the contact structure 230 and the interconnection line 250.

By way of summation and review, a decreased CD of the contact may cause an increase in contact resistance and various defects. Accordingly, various methods of manufacturing a semiconductor device having improved performance while addressing limitations caused by high integration of semiconductor elements may be considered.

An ion implantation process may be applied to a seed layer, a deposition surface, or another contact metal to change (increase or decrease) a grain size (e.g., average grain size). As the grain size (e.g., average grain size) is changed, a grain size (e.g., average grain size) of a contact metal to be deposited in a subsequent process may be increased to provide a low-resistance contact structure.

One or more embodiments may provide a semiconductor device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:

forming a gate structure and a source/drain region on a fin active region at least one side of the gate structure on a substrate;

forming an insulating structure covering the fin active region, the gate structure, and the source/drain region;

forming a contact hole exposing a portion of the source/drain region through the insulating structure;

forming a seed layer having a first grain size on an exposed portion of the source/drain region;

applying an ion implantation process to the seed layer such that an upper region of the seed layer is amorphous or has a grain size different from the first grain size, and a lower region of the seed layer has the first grain size; and, forming a contact plug having a second grain size on the seed layer within the contact hole.

2. The method of claim 1, wherein the seed layer includes tungsten, a titanium nitride (TiN), a tantalum nitride (TaN), a titanium silicon nitride (TiSiN), a tungsten carbonitride (WCN), or a tungsten nitride (WN).

3. The method of claim 1, wherein the contact plug includes molybdenum (Mo), ruthenium (Ru), tungsten (W), or cobalt (Co).

4. The method of claim 1, wherein the second grain size is 7 nm or more.

5. The method of claim 1, wherein the contact hole has a bottom width of 20 nm or less.

6. The method of claim 1, wherein the seed layer has a thickness of 5 nm or less.

7. The method of claim 1, wherein the contact plug is in direct contact with the insulating structure on a sidewall of the contact hole.

8. The method of claim 1, wherein the seed layer includes:
a first portion on a bottom of the contact hole, and
a second portion extending from the first portion onto a sidewall of the contact hole.

9. The method of claim 8, wherein:
the first portion of the seed layer includes the lower region and the upper region, and
the second portion of the seed layer is amorphous.

10. The method of claim 1, further comprising forming a crystalline silicide layer on the exposed portion of the source/drain region, before the forming the seed layer,
wherein the seed layer is formed on the crystalline silicide layer.

11. The method of claim 1, further comprising:
forming an interlayer insulating layer on the contact plug and the insulating structure;
forming a via hole exposing a contact region of the contact plug through the interlayer insulating layer;
applying an additional ion implantation process to an exposed contact region of the contact plug to form a grain adjustment region, wherein the grain adjustment region is amorphous or has a grain size different from the second grain size of the contact plug; and,
forming a contact via on the grain adjustment region by filling the via hole.

12. The method of claim 1, further comprising:
applying an additional ion implantation process to an upper region of the contact plug to form a grain adjustment region, wherein the grain adjustment region is amorphous or has a grain size different from the second grain size of the contact plug;
forming an interlayer insulating layer on the grain adjustment region of the contact plug and the insulating structure;
forming a via hole exposing a contact region of the grain adjustment region through the interlayer insulating layer; and,
forming a contact via on an exposing contact region of the grain adjustment region by filling the via hole.

13. The method of claim 1, wherein the gate structure includes a gate electrode extending to intersect the fin active region, and a gate insulating layer between the gate electrode and the fin active region.

14. The method of claim 1, further comprising a plurality of channel layers spaced apart from each other in a direction, perpendicular to an upper surface of the substrate, on the fin active region,
wherein the gate structure includes a gate electrode, surrounding the plurality of channel layers and extending to intersect the fin active region, and a gate insulating layer between the plurality of channel layers and the gate electrode and between the fin active region and the gate electrode.

15. A method of manufacturing a semiconductor device, the method comprising:
preparing a substrate having a contact region;
forming a first insulating layer on the substrate;
forming a first contact hole connected the contact region through the first insulating layer;
forming a seed layer including a first polycrystalline conductive material on the contact region within the first contact hole, the first polycrystalline conductive material having a first grain size;
applying a first ion implantation process to the seed layer such that an upper region of the seed layer has a grain size greater than the first grain size, and a lower region of the seed layer has the first grain size;
forming a first contact via including a second polycrystalline conductive material on the upper region of the seed layer, the second polycrystalline conductive material having a second grain size;
forming a second insulating layer on the first contact via and the first insulating layer;
forming a second contact hole exposing a portion of the first contact via through the second insulating layer;
applying a second ion implantation process to an exposed portion of the first contact via such that the exposed portion is amorphous or has a grain size different from the second grain size, while the other portion lower region having the second grain size; and
forming a second contact via on the exposed portion of the first contact via by filling the second contact hole.

16. The method of claim 15, wherein an upper surface of the first contact via includes a first region, provided by the exposed portion and having a non-planar surface, and a second region around the first region and having a surface coplanar with a surface of the second insulating layer.

17. The method of claim 15, wherein:
the first polycrystalline conductive material includes tungsten (W), and
the second polycrystalline conductive material includes molybdenum (Mo).

18. The method of claim 17, wherein the second contact via includes molybdenum (Mo), ruthenium (Ru), tungsten (W), cobalt (Co), or copper (Cu).

19. A method of manufacturing a semiconductor device, the method comprising:
preparing a substrate having a contact region;
forming an insulating layer on the substrate;
forming a contact hole connected to the contact region through the insulating layer;
forming a seed layer including a first polycrystalline conductive material on the contact region within the contact hole, the first polycrystalline conductive material having a first grain size;
applying an ion implantation process to the seed layer such that an upper region of the seed layer is amorphous or has a grain size smaller than the first grain size, and a lower region of the seed layer has the first grain size; and
forming a contact via including a second polycrystalline conductive material on the upper region of the seed layer.

20. The method of claim 19, wherein:
the first polycrystalline conductive material includes a titanium nitride (TiN), a tantalum nitride (TaN), a titanium silicon nitride (TiSiN), a tungsten carbonitride (WCN), or a tungsten nitride (WN), and
the second polycrystalline conductive material includes tungsten (W).

* * * * *